(12) United States Patent
Hiwatashi et al.

(10) Patent No.: US 12,736,441 B2
(45) Date of Patent: Sep. 15, 2026

(54) VEHICLE DEVELOPMENT SUPPORT SYSTEM

(71) Applicant: SUBARU CORPORATION, Tokyo (JP)

(72) Inventors: Yutaka Hiwatashi, Tokyo (JP); Yuji Tanizaki, Tokyo (JP); Atsushi Udagawa, Tokyo (JP); Tsunehiro Watanabe, Tokyo (JP); Satoshi Naruse, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 69 days.

(21) Appl. No.: 17/925,101

(22) PCT Filed: Jun. 7, 2021

(86) PCT No.: PCT/JP2021/021650
§ 371 (c)(1),
(2) Date: Nov. 14, 2022

(87) PCT Pub. No.: WO2022/259342
PCT Pub. Date: Dec. 15, 2022

(65) Prior Publication Data
US 2024/0402050 A1 Dec. 5, 2024

(51) Int. Cl.
*G01M 17/007* (2006.01)
*G06F 30/15* (2020.01)

(52) U.S. Cl.
CPC ........... *G01M 17/007* (2013.01); *G06F 30/15* (2020.01)

(58) Field of Classification Search
None
See application file for complete search history.

(56) References Cited

U.S. PATENT DOCUMENTS 10,169,928 B2 * 1/2019 Chen ........................ G06F 30/20
11,262,738 B2 * 3/2022 Feyerabend ....... G05B 23/0256
(Continued)

FOREIGN PATENT DOCUMENTS

JP 2004-145685 A 5/2004
JP 2011252805 A * 12/2011
(Continued)

OTHER PUBLICATIONS

Sasaki, "For Development of Advanced Driver Assistance Systems," Video Information Industrial, vol. 48, No. 5 (867), pp. 61-64, May 1, 2016 (Year: 2016).*
(Continued)

*Primary Examiner* — Redhwan K Mawari
*Assistant Examiner* — Kai Wang
(74) *Attorney, Agent, or Firm* — Rimon P.C.

(57) ABSTRACT

A vehicle development support system includes a frame body equipped with electronic control units installed in a vehicle, a real-time simulator that calculates physical state amounts for operating in-vehicle devices controlled by the electronic control units using control signals for the electronic control units and simulate operations of the in-vehicle devices and a behavior of the vehicle caused by the operations, and a synchronizer that synchronizes communication in which the electronic control units receive outputs from the real-time simulator with communication in which the real-time simulator receives the control signals for the electronic control units. The real-time simulator includes an external information acquisition interface that acquires, as external information, driving information obtained by driving a vehicle in a real space. In a virtual space of a simulation result in which the external information is reflected, driving of the vehicle in which the control signals are reflected is reproduced.

24 Claims, 3 Drawing Sheets

(56) References Cited

U.S. PATENT DOCUMENTS

| | | | | |
|---|---|---|---|---|
| 2002/0029136 | A1* | 3/2002 | Hagiwara | G01M 13/02 703/8 |
| 2004/0210432 | A1* | 10/2004 | Kamiyama | G06F 30/15 703/17 |
| 2007/0260373 | A1* | 11/2007 | Langer | G01M 17/04 701/31.4 |
| 2009/0312850 | A1* | 12/2009 | Higuchi | G05B 17/02 700/29 |
| 2015/0046742 | A1* | 2/2015 | Hata | G06F 1/14 713/502 |
| 2016/0300000 | A1* | 10/2016 | Takeshita | G05B 19/41885 |
| 2019/0043278 | A1* | 2/2019 | Stefan | G06Q 50/10 |
| 2019/0303759 | A1* | 10/2019 | Farabet | G06F 18/24133 |
| 2020/0331481 | A1* | 10/2020 | Szczerba | A61B 5/02055 |
| 2021/0141710 | A1* | 5/2021 | Komoriya | G06F 11/3447 |
| 2022/0402515 | A1* | 12/2022 | Aono | B60W 60/001 |

FOREIGN PATENT DOCUMENTS

| | | | | |
|---|---|---|---|---|
| JP | 2012-137332 | A | | 7/2012 |
| JP | 2020038590 | A | * | 3/2020 |
| WO | 2018-110118 | A1 | | 6/2018 |
| WO | 2021/075089 | A1 | | 4/2021 |

OTHER PUBLICATIONS

Shigeru Sasaki, "For Development of Advanced Driver Assistance Systems," Video Information Industrial, vol. 48, No. 5 (867), pp. 61-64, May 1, 2016.

Notice of Reasons for Refusal received in corresponding Japanese Patent Application No. 2023-527185, dated Apr. 23, 2024.

* cited by examiner

Figure 1:
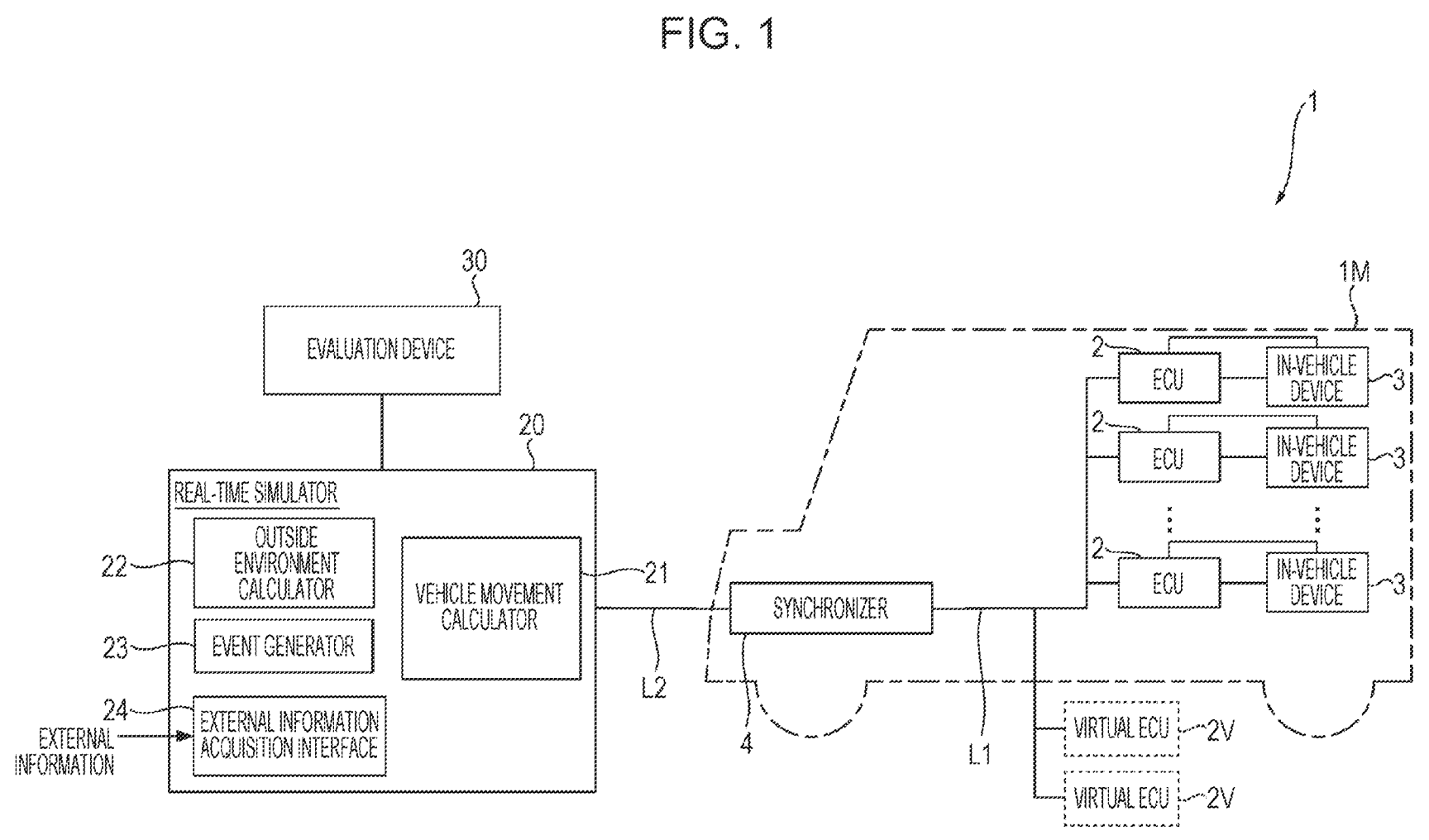

IN-VEHICLE DEVICE

3

ECU

2

VIRTUAL ECU

2V

L1

SYNCHRONIZER

4

L2

21

20

VEHICLE MOVEMENT CALCULATOR

30

EVALUATION DEVICE

REAL-TIME SIMULATOR

OUTSIDE ENVIRONMENT CALCULATOR

EVENT GENERATOR

EXTERNAL INFORMATION ACQUISITION INTERFACE

22

23

24

EXTERNAL INFORMATION

FIG. 2

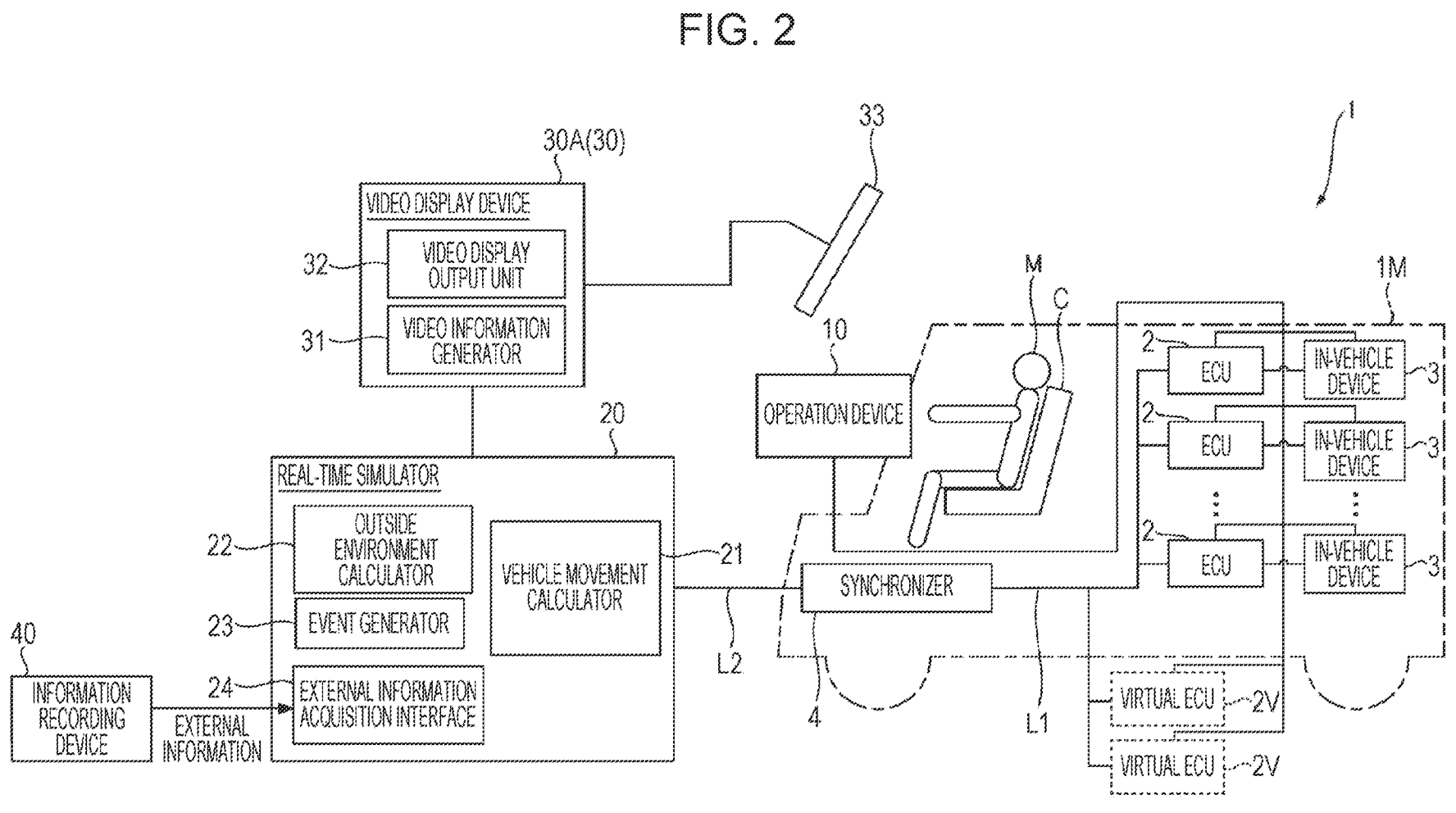

1
1M
IN-VEHICLE DEVICE
3
ECU
2
VIRTUAL ECU
2V
C
M
L1
SYNCHRONIZER
4
OPERATION DEVICE
10
33
L2
21
20
VEHICLE MOVEMENT CALCULATOR
REAL-TIME SIMULATOR
OUTSIDE ENVIRONMENT CALCULATOR
EVENT GENERATOR
EXTERNAL INFORMATION ACQUISITION INTERFACE
22
23
24
EXTERNAL INFORMATION
30A(30)
VIDEO DISPLAY DEVICE
VIDEO DISPLAY OUTPUT UNIT
VIDEO INFORMATION GENERATOR
32
31
INFORMATION RECORDING DEVICE
40

VEHICLE DEVELOPMENT SUPPORT SYSTEM

CROSS REFERENCE TO RELATED APPLICATIONS

This application is the U.S. National Phase under 35 US.C. § 371 of International Application No. PCT/JP2021/021650, filed on Jun. 7, 2021, the entire contents of each are hereby incorporated by reference.

TECHNICAL FIELD

The present invention relates to a vehicle development support system that supports development of vehicles.

BACKGROUND ART

Hitherto, as an evaluation system used to develop vehicles, a system that evaluates the control performance of a vehicle is known, the system using electronic control units (ECU) that control the behaviors of actuators or the like installed in the vehicle or using a control system including a plurality of ECUs. This evaluation system, instead of a prototype vehicle being manufactured, configures a virtual vehicle using an actual machine and a simulator. The actual machine includes ECUs, which are to be installed in a vehicle, and the simulator simulates the behavior of the vehicle on the basis of a vehicle model set in accordance with the actual machine. This evaluation system evaluates the control performance of each ECU in the virtual vehicle by setting various test conditions for the virtual vehicle or control parameters for controlling the virtual vehicle (see PTL 1 below).

CITATION LIST

Patent Literature

PTL 1: Japanese Unexamined Patent Application Publication No. 2012-137332

SUMMARY OF INVENTION

Technical Problem

In the above-described existing technology, an operation personal computer (PC) sets a plurality of test condition values for the above-described virtual vehicle in the simulator and performs an evaluation test by setting values of the control parameters for controlling the operation of the virtual vehicle in the ECUs of the actual machine.

However, with this existing technology, it is difficult to correctly simulate, using set conditions, driving information for a case where a vehicle actually travels on a road in real space and the behavior of the vehicle based on the driving information. Thus, it is not assumed that the effects of a plurality of ECUs of the vehicle on each other are to be reproduced by reflecting, in a simulation result, a driving operation performed by the driver who is driving the vehicle in real space and the behavior of the vehicle caused by the driving operation.

Thus, an object of the present invention is to provide a vehicle development support system that can reflect, in a simulation result, a driving operation performed by the driver who is driving a vehicle in real space and the behavior of the vehicle caused by the driving operation.

Solution to Problem

In order to solve such a problem, a vehicle development support system according to an embodiment of the present invention includes a frame body equipped with electronic control units that are to be installed in a vehicle, a real-time simulator configured to calculate physical state amounts for operating in-vehicle devices to be controlled by the electronic control units using control signals for the electronic control units and simulate operations of the in-vehicle devices and a behavior of the vehicle to be caused by the operations, and a synchronizer configured to synchronize communication in which outputs from the real-time simulator are input to the electronic control units with communication in which the control signals are input to the real-time simulator. The real-time simulator includes an external information acquisition interface configured to acquire, as external information, driving information obtained by driving a vehicle in a real space. In a virtual space of a simulation result in which the external information is reflected, driving of the vehicle in which the control signals are reflected is reproduced.

Advantageous Effects of Invention

Regarding a vehicle development support system according to an embodiment of the present invention, a driving operation performed by the driver who is driving a vehicle in real space and the behavior of the vehicle caused by the driving operation can be reflected in a simulation result.

BRIEF DESCRIPTION OF DRAWINGS

FIG. 1 is an explanatory diagram illustrating a system configuration of a vehicle development support system according to an embodiment of the present invention.

FIG. 2 is an explanatory diagram illustrating a system configuration of a vehicle development support system according to another embodiment of the present invention.

DESCRIPTION OF EMBODIMENTS

Figure 3:
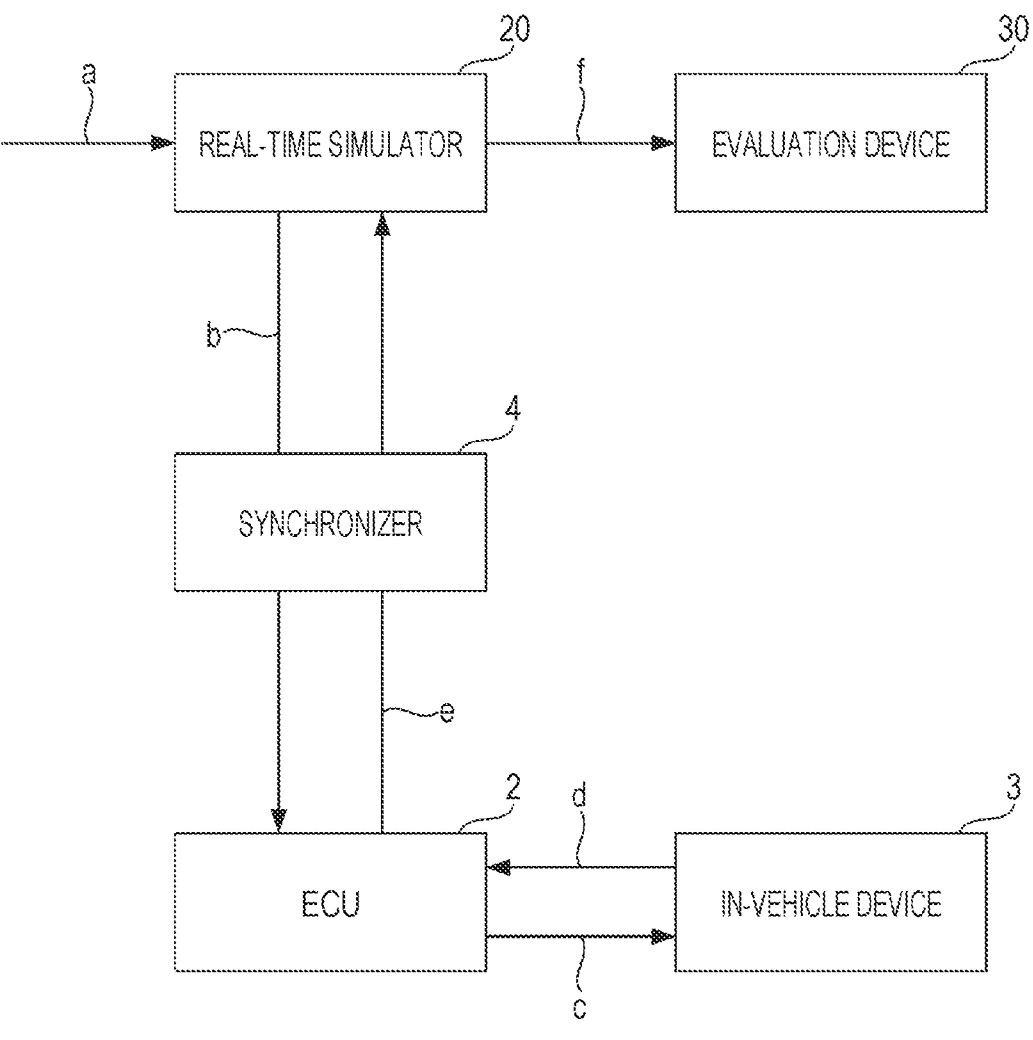
FIG. 3 is an explanatory diagram for describing the flow of information in a vehicle development support system according to an embodiment of the present invention.

In the following, embodiments of the present invention will be described with reference to the drawings. In the following description, the same reference signs in different drawings indicate portions having the same function, and redundant description for each drawing will be omitted as appropriate.

As illustrated in FIG. 1, a vehicle development support system 1 according to an embodiment of the present invention has a frame body 1M equipped with a plurality of electric control units (ECUs) 2, which are to be installed in a vehicle. The plurality of ECUs 2 are to be evaluated in the vehicle, and the frame body 1M is equipped with a plurality of in-vehicle devices 3 controlled by the ECUs 2.

Selected ones from among or all of the plurality of ECUs 2 and the plurality of in-vehicle devices 3 in the vehicle development support system 1 are to be evaluated. The plurality of ECUs 2 are connected to each other such that two-way communication is possible via a communication line L1 such as an in-vehicle network (for example, Controller Area Network (CAN) or the like), similarly to as in a vehicle that is actually traveling on a public road (hereinafter referred to as a vehicle).

The vehicle development support system 1 includes one or more virtual ECUs 2V as needed. A virtual ECU 2V is a form of an ECU 2 described above and simulates, instead of an ECU that is an actual item (an actual ECU) to be installed in an actual vehicle, an electronic control behavior of the ECU (an electronic control function) exhibited when the actual ECU is installed in the vehicle. This virtual ECU 2V can be configured using a general-purpose controller such as rapid control prototyping (RCP), or a PC. By configuring an ECU or the like under development by using this virtual ECU 2V, cooperation of ECUs of the entire vehicle can be evaluated even during development.

The in-vehicle devices 3, with which the frame body 1M is equipped, are some of the in-vehicle devices, which are to be installed in the vehicle, and include various types of sensors and actuators configured to operate the devices. For example, a powertrain in-vehicle device can be eliminated from the frame body 1M. However, by using ECUs 2 (actual ECUs) and virtual ECUs 2V, the vehicle development support system 1 can be equipped with ECUs configured to control all the in-vehicle devices that are to be installed in an actual vehicle including the in-vehicle device(s) eliminated from the frame body 1M.

The vehicle development support system 1 includes a real-time simulator 20. The real-time simulator 20 can be configured by a computer including a plurality of processors and a memory in which programs to be executed by the processors are stored. This real-time simulator 20 calculates, on the basis of control signals for the ECUs 2 and the virtual ECUs 2V, physical state amounts for operating the in-vehicle devices 3, and simulates the operations of the in-vehicle devices 3 and also the behavior of the vehicle caused by the operations of the in-vehicle devices 3. Note that a state, a data region, or both the state and the data region obtained from a simulation result from the real-time simulator 20 are called a virtual space.

A software configuration of the real-time simulator 20 includes a vehicle movement calculator (a vehicle movement calculation model) 21, an outside environment calculator (an outside environment calculation model) 22, and an event generator (an event generation model) 23. The vehicle movement calculator 21 calculates physical state amounts for in-vehicle devices and the vehicle, which are to be controlled, and outputs a simulation result. The outside environment calculator 22 calculates outside environments that affect the behavior of the vehicle and reflects the outside environments in the simulation result. The event generator 23 generates an event for the outside environments and reflects the event in the simulation result.

The real-time simulator 20 includes an external information acquisition interface 24 configured to acquire external information. External information is driving information obtained by actually driving the vehicle on a road or the like in real space or driving video information based on images obtained by capturing surroundings of the vehicle, images obtained by capturing passengers, or images obtained by capturing driving operations. The external information is input to the real-time simulator 20 via the external information acquisition interface 24.

The driving information in this case is time-series information corresponding to real time and includes, for example, operation signals (operation amounts) output from an operation device of the vehicle when the vehicle is actually driven (such as a steering operation system, an accelerator operation system, a brake operation system, a shift operation system, or operation switches for various types of in-vehicle device), detection signals output from various sensors of the vehicle when the vehicle is actually driven (physical state amounts for the vehicle or position information about the vehicle), or signal transmission-reception information regarding an in-vehicle network (for example, CAN). The driving video information described above is also time-series information and is video signals output from image capturing devices of the vehicle (including image capturing devices provided inside and outside the vehicle) when the vehicle is actually driven.

Note that the time line (real time) of external information input to the real-time simulator 20 is absolute time in real space, and the time line (real time) of the virtual space in the real-time simulator 20 is synchronization time obtained in a synchronized manner by a synchronizer 4, which is described later.

The external information acquisition interface 24 can be configured by, for example, a wireless communication interface. With this, external information (the driving information or driving video information described above) can be received, the external information being transmitted directly or via the cloud from the traveling vehicle. In this case, when communication via the cloud is used, external information can be received from a remote site. The external information acquisition interface 24 may receive information from an information recording device 40 (such as a data logger) in which external information (the driving information or driving video information described above) is recorded as time-series information (see FIG. 2).

The vehicle development support system 1 includes the synchronizer 4. The synchronizer 4 synchronizes communication in which outputs from the real-time simulator 20, the outputs including the external information described above, are input to the plurality of ECUs 2 with communication in which control signals output from the plurality of ECUs 2 are input to the real-time simulator 20.

This synchronizer 4 is an interface through which the communication line L1 on the ECU 2 side is synchronized with and connected to a communication line L2 on the real-time simulator 20 side. Through the synchronizer 4, processing performed by the ECUs 2 to transmit control signals can be synchronized with processing performed by the real-time simulator 20 to output a simulation result. Note that one ECU 2 and the other ECUs 2 of the vehicle development support system 1 are connected to each other such that two-way communication is possible via the communication line L1 of the in-vehicle network (for example, CAN), and thus synchronized communication can be performed with each other.

Moreover, the vehicle development support system 1 includes an evaluation device 30. The evaluation device 30 is configured to evaluate operations of the plurality of ECUs 2 or the in-vehicle devices 3 on the basis of a simulation result from the real-time simulator 20, the control signals for the ECUs 2 being reflected in the simulation result. The evaluation device 30 is configured by a computer including one or more processors and a memory in which programs for operating the one or more processors are stored. Information input to the evaluation device 30 is subjected to arithmetic processing by the processor(s) in accordance with an evaluation program. Information regarding the processing result is displayed as video information generated by a video display device 30A, which is described below, such that an evaluator can visually observe the information. Alternatively, the information is printed out for the evaluator to make an evaluation or is transmitted to another computer.

The evaluation device 30 is configured to evaluate, as one example, operations of the ECUs 2 by analyzing the simulation result from the real-time simulator 20 and can be configured by, for example, a PC connected to the real-time simulator 20. The evaluation device 30 is configured to evaluate operation characteristics of each ECU 2 or the effects of the plurality of ECUs 2 on each other by, for example, applying various types of statistical processing to the simulation result, which is time-series information. Moreover, the evaluation device 30 may be configured to make an evaluation by comparing the operation characteristics of the ECUs of the traveling vehicle obtained as external information and the operation characteristics of the ECUs 2 of the vehicle, the frame body 1M being equipped with the ECUs 2.

The evaluation device 30 can be configured by, for example, a PC configured to perform information processing as described above; however, the evaluation device 30 may be a device that can visualize the simulation result from the real-time simulator 20 and allow an evaluator to visually observe the simulation result and make an evaluation.

In order to achieve visualization and perform an evaluation, the evaluation device 30 includes the video display device 30A as illustrated in FIG. 2. The video display device 30A is configured to generate video information using the simulation result from the real-time simulator 20 and display the generated video information such that the evaluator can visually observe the simulation result. The video display device 30A includes a video information generator 31 configured to generate video information, a video display output unit 32 configured to output the generated video information, and a display 33 configured to display the output video information as a moving image. By provision of the display 33, not only an operator M sitting in a cockpit C of the frame body 1M but also a plurality of evaluators can visually observe a video based on the simulation result, and information for making an evaluation can be shared by a plurality of persons.

Video information generated by the video display device 30A is displayed in synchronization with the control signals for the ECUs 2 in which the simulation result from the real-time simulator 20 is reflected, so that the operations of the ECUs 2 can be evaluated in real time, and also the responsiveness of the operation of each ECU 2 can be visually observed and evaluated. Synchronization in this case does not always have to be in the same communication cycle as synchronization achieved by the synchronizer 4. It is sufficient that the display 33 be synchronized with an operation device 10, which is described later, to the extent that the evaluator does not feel a time lag on the basis of the feeling the evaluator had when they visually observed the video information.

Moreover, the vehicle development support system 1 includes the operation device 10 as needed, as illustrated in FIG. 2. The operation device 10 is configured to output operation signals when the operator M sitting in the cockpit C of the frame body 1M intentionally inputs an operation and transmit these operation signals to the ECUs 2 and in-vehicle device 3, which are to be evaluated. This operation device 10 is a vehicle operation system (for example, the steering operation system, the accelerator operation system, the brake operation system, the shift operation system, or the operation switches for various types of in-vehicle device), and is installed at a position corresponding to that of an actual vehicle whose development is supported. Note that the operation device 10 of the vehicle development support system 1 may be a device obtained by simulating an operation device that is to be installed in an actual vehicle (for example, an operation device created in an abbreviated manner). Moreover, the operation device 10 may be provided on the real-time simulator 20, which will be described in light of an actual vehicle.

The flow of information in the vehicle development support system 1 will be described using FIG. 3. When the real-time simulator 20 receives external information a via the external information acquisition interface 24, the real-time simulator 20 outputs an output signal b including the external information a. This output signal b is selectively input to the plurality of ECUs 2, with which the frame body 1M is equipped, via the synchronizer 4. More specifically, the output signal b is a signal synchronized with a communication timing of the communication line L1 (for example, CAN) by the synchronizer 4 and is transmitted via the communication line L1 to an ECU 2, which is operated by the output signal b, among the ECUs 2.

The output signal b in this case is an output from the real-time simulator 20, the output including driving information obtained by actually driving a vehicle. The ECU 2 performs arithmetic processing on the basis of the received output signal b and outputs a control signal c for an in-vehicle device 3 that the ECU 2 controls. In this case, the ECU 2 to be evaluated receives, as the output signal b, information obtained only by actually driving the vehicle, and the ECU 2 outputs the control signal c in a state in which actual driving of a vehicle is simulated.

The control signal c output by the ECU 2 that is to be evaluated is transmitted to an in-vehicle device 3 among the in-vehicle devices 3, with which the frame body 1M is equipped, in a case where the in-vehicle device 3 is to be evaluated. When the in-vehicle device 3 receives the control signal c, the actuator of the in-vehicle device 3 operates, and a closed loop for feeding back, to the ECU 2, a detection signal d from a sensor configured to detect the operation of the in-vehicle device 3 is formed. As a result, the in-vehicle devices 3, with which the frame body 1M is equipped, are controlled in a state in which actual driving of a vehicle is simulated.

Moreover, control signals e output by the ECUs 2 are transmitted to the real-time simulator 20 via the synchronizer 4. The real-time simulator 20 having received the control signals e calculates, using the control signals e, a physical state amount for operating an in-vehicle device that is to be controlled (for example, a powertrain system with which the frame body 1M is not equipped), and simulates the operation of the in-vehicle device and the behavior of the vehicle caused by the operation of the in-vehicle device.

A simulation result from the real-time simulator 20 using the control signals e is transmitted as an output signal f to the evaluation device 30 and is also reflected in output signals b, which are to be output. As a result, the output signal f transmitted to the evaluation device 30 is a simulation result in which the control signals e are reflected, the control signals e being results obtained by the ECUs 2 performing arithmetic processing on the basis of the external information a. By evaluating this simulation result, the evaluation device 30 can evaluate as appropriate the control performances of the ECUs 2 that are operating in a state corresponding to actual driving of a vehicle, the operation performances of the in-vehicle devices controlled by the ECUs 2, and the behavior performance of the vehicle due to the operations of the in-vehicle devices.

In this case, detection signals obtained by detecting the operations of the in-vehicle devices 3 are transmitted to the evaluation device 30, so that the evaluation device 30 can evaluate the operations of the in-vehicle devices 3 in accordance with evaluation conditions. Moreover, the evaluation device 30 can make an evaluation by comparing the output signals b, in which the operation characteristics of the ECUs of the traveling vehicle obtained as the external information a are reflected, and the operation characteristics of the ECUs 2 of the vehicle, the frame body 1M being equipped with the ECUs 2.

In this case, in a case where the external information a obtained from the traveling vehicle is transmitted to the real-time simulator 20 in accordance with absolute time in real space, driving of the vehicle in real space is reproduced in a virtual space of the real-time simulator 20. In the virtual space of the real-time simulator 20, driving of the vehicle in real space is reproduced by reflecting the control signals for the ECUs 2 at the time of synchronization achieved by the synchronizer 4. Moreover, in a case where past external information a recorded on a recording medium is transmitted to the real-time simulator 20, external information a loaded from the recording medium into the real-time simulator 20 is reproduced as driving of a vehicle in the virtual space. In the virtual space, driving of the vehicle is reproduced by reflecting the control signals for the ECUs 2 at the time of synchronization achieved by the synchronizer 4.

Note that the evaluation device 30 may evaluate signals c, which are transmitted from the real-time simulator 20 and output through the synchronizer 4 to the ECU 2 and then to be transmitted to the in-vehicle devices 3. The output signals b in this case are based on the output signal f, which is to be transmitted to the evaluation device 30, and the evaluation device 30 evaluates, monitors, or evaluates and monitors the in-vehicle devices 3 from a fixed point.

The vehicle development support system 1 like this can reflect, in a simulation result, a driving operation performed by the driver who is driving a vehicle in real space and the behavior of the vehicle caused by the driving operation, and the effects of a plurality of ECUs of the vehicle on each other can be made to correspond to actual driving of the vehicle. Note that driving of the vehicle in this case includes a driving operation performed by the driver and the behavior of the vehicle caused by the driving operation.

In one example, the vehicle development support system 1 can verify, within a predetermined allowed time, the effects of a specific ECU 2 or the plurality of ECUs 2 on each other. In that case, the operation of the vehicle based on an actual driver operation can be verified by using actual driving information as the external information a. Furthermore, by obtaining an operation signal from the external information a, an evaluation environment where the effects of a plurality of in-vehicle devices on each other controlled by the plurality of ECUs 2 or the ECU 2 can be reproduced can be constructed from a development initial stage, which is before an operation device is developed.

Moreover, verification in a case where a driver operation is changed in various ways can be performed as needed by making an evaluation in accordance with actual driving of a vehicle, and responsiveness to a change in driver operation can be correctly verified.

Moreover, the verification of the operation of the vehicle based on a driver operation can be performed in accordance with the characteristics of the driver. The vehicle can be evaluated in accordance with the characteristics of a driver categorized, for example, by age group (young age group, middle age group, senior age group, or the like), by gender, by years of driving experience (a beginner driver, a veteran driver), or the like.

Furthermore, by using big data based on Cloud communication as the external information a, not only verification and evaluation of the vehicle can be performed but also big data can be used to analyze problems of the market or make a plan for the problems.

In addition, the state of the vehicle that is actually traveling can be checked from a remote place apart from the traveling vehicle by acquiring, through Cloud communication, driving video information such as a captured video of an area in front of the traveling vehicle, a video of the driver's face expressions, or a video of driving operations performed by the driver.

Note that, in a case where the operation of a specific ECU 2 or a specific in-vehicle device is to be evaluated in the vehicle development support system 1, a driver is caused to drive in a driving situation for making that evaluation, necessary information is acquired from the external information a, and also a situation in which the specific ECU 2 operates is simulated by the real-time simulator 20.

In one example, in a case where in-vehicle devices 3 regarding brake control (for example, an anti-lock braking system (ABS), a traction control system (TCS), electronic stability control (ESC), or the like) and the ECUs 2 configured to control the in-vehicle devices 3 (ABS ECU, TCS ECU, ESC ECU, or the like) are to be evaluated, the external information a is acquired by performing a brake operation or a steering operation corresponding to the brake operation through a driver operation performed while the vehicle is actually traveling.

By acquiring this external information a, output signals b from the real-time simulator 20, the output signals b including operation signals such as a brake operation or a steering operation, are input to the ECUs 2 (ABS ECU, TCS ECU, ESC ECU, or the like). Control signals e obtained by these ECUs 2 performing arithmetic processing are transmitted to the real-time simulator 20. The real-time simulator 20 calculates, in accordance with these control signals e, physical state amounts for the in-vehicle devices 3 and the vehicle and transmits, to the evaluation device 30, a situation in which the vehicle is braked as a output signal f. In this case, when the video display device 30A is used as the evaluation device 30, a video of the behavior of the vehicle into which the simulation result f is converted is displayed on the display 33.

For example, the behavior of the vehicle when the brake is controlled varies greatly depending on the road conditions; however, by acquiring this external information a, the real-time simulator 20 can set the road conditions or the like in various ways using the outside environment calculator 22 and calculate the simulation result f through arithmetic processing. Thus, the performance of brake control in various situations can be evaluated by changing as appropriate the road conditions to be set.

As another example, a case will be described in which the ECU 2 (AFS ECU) of an adaptive front-lighting system (AFS) is to be evaluated. This ECU 2 (AFS ECU) automatically changes a light distribution pattern in accordance with various driving environments (driving along a curve, driving in an urban area, high-speed driving, driving in rain). A driver operation such as driving along a curve is performed to acquire the external information a, and a situation such as driving in an urban area, high-speed driving, driving in rain, or the like is set in the real-time simulator 20. As a result, the output signal b including the situation, in which the ECU 2 (AFS ECU) operates, is output from the real-time simulator 20.

This output signal b is then input to the ECU 2 (AFS ECU) to operate the in-vehicle device 3, so that the operation state of the in-vehicle device 3 can be checked. Moreover, the control signal e obtained by the ECU 2 (AFS ECU) performing arithmetic processing is transmitted to the real-time simulator 20, and the simulation result f is obtained. By converting this simulation result f into a video using the video display device 30A, AFS light distribution patterns in various situations can be evaluated through the video.

In addition to this, in a case where driving assistance systems called advanced driver-assistance systems (ADAS) are to be evaluated, an output signal b is obtained from the real-time simulator 20 by reflecting, in the external information a based on a driver operation, arithmetic processing performed by the outside environment calculator 22 and the event generator 23 of the real-time simulator 20. This output signal b is then input to the ECU 2 (ADAS ECU) to obtain a control signal e and obtains a simulation result f from the control signal e, so that the ADAS performance in various situations can be evaluated by, for example, converting the ADAS performance into a video.

Moreover, as illustrated in FIG. 2, in a case where the operator M is caused to sit in the cockpit C, and an operation signal from the operator M is to be input to ECUs 2 or in-vehicle devices 3, an operation input by the operator M while driving of an actual vehicle is being reproduced in a virtual space of the real-time simulator 20 can be reflected in driving of the vehicle in the virtual space. As a result, conditions that are difficult to reproduce while actually driving a vehicle or driving that cannot be performed on regular roads due to regulations or for safety reasons (for example, opening and closing the door of a traveling vehicle or the like) is reproduced, and the operations of the ECUs 2 or in-vehicle devices 3 can be evaluated.

In the above, the embodiments of the present invention have been described in detail with reference to the drawings; however, specific configurations are not limited to these embodiments, and design changes or the like that do not depart from the gist of the present invention are also included in the present invention. Moreover, technologies of the respective embodiments described above can be borrowed from each other and combined as long as any contradiction or problem does not arise in terms of objective and structure.

REFERENCE SIGNS LIST

1 vehicle development support system
1M frame body
2 ECU
2V virtual ECU
3 in-vehicle device
4 synchronizer
10 operation device
20 real-time simulator
21 vehicle movement calculator
22 outside environment calculator
23 event generator
24 external information acquisition interface
30 evaluation device
30A video display device
31 video information generator
32 video display output unit
40 information recording device
M operator
C cockpit
L1, L2 communication line

The invention claimed is:

1. A vehicle development support system comprising:
a frame body equipped with physical electronic control units configured to control in-vehicle devices;
a real-time simulator; and
a synchronizer configured to synchronize timing of data exchange between the real-time simulator and the electronic control units,
wherein the real-time simulator configured to:
acquire, via an external information acquisition interface, sensor-based driving information obtained by driving a vehicle in a real space, the sensor based driving information including time series operation information including operation signals output from an operation device of the vehicle, the operation device including at least one of a steering device, an accelerator device, and a brake device, in accordance with an operation intentionally performed by an operator, the operation signals indicating operation amounts and operation timing of the at least one of the steering device, the accelerator device, and the brake device;
provide output signals including the sensor-based driving information to the electronic control units through the synchronizer;
receive control signals generated based on the output signals from the electronic control units through the synchronizer;
calculate physical state amounts indicating operation states of the in-vehicle devices based on the received control signals;
simulate, based on the physical state amounts, operations of the in-vehicle devices at a device level;
simulate, based on the operations of the in vehicle devices, a behavior of the vehicle caused by the operations of the in vehicle devices;
generate a simulation result including the behavior of the vehicle; and
provide subsequent output signals including subsequent sensor based driving information to the electronic control units through the synchronizer, the subsequent output signals reflecting the behavior of the vehicle included in the simulation result, and
wherein the synchronizer is configured to synchronize timing at which the real-time simulator provides the output signals to the electronic control units with timing at which the real-time simulator receives the control signals from the electronic control units.

2. The vehicle development support system according to claim 1, further comprising an evaluation device configured to evaluate, using the simulation result, operations of the electronic control units or the operations of the in-vehicle devices controlled by the electronic control units.

3. The vehicle development support system according to claim 1, wherein the external information acquisition interface receives the sensor-based driving information transmitted from the vehicle while the vehicle is traveling.

4. The vehicle development support system according to claim 1, wherein the external information acquisition interface receives the sensor-based driving information from an information recording device in which the sensor-based driving information is recorded.

5. The vehicle development support system according to claim 1, further comprising a further operation device located on the frame body and configured to output, in accordance with an operation intentionally performed by an operator, operation signals that are to be input to the electronic control units.

6. The vehicle development support system according to claim 1, further comprising a video display device configured to generate video information using the simulation result from the real-time simulator and display the video information.

7. The vehicle development support system according to claim 2, wherein the external information acquisition interface receives the sensor-based driving information transmitted from the vehicle while the vehicle is traveling.

8. The vehicle development support system according to claim 2, wherein the external information acquisition interface receives the sensor-based driving information from an information recording device in which the sensor-based driving information is recorded.

9. The vehicle development support system according to claim 2, further comprising a further operation device located on the frame body and configured to output, in accordance with an operation intentionally performed by an operator, operation signals that are to be input to the electronic control units.

10. The vehicle development support system according to claim 3, further comprising a further operation device located on the frame body and configured to output, in accordance with an operation intentionally performed by an operator, operation signals that are to be input to the electronic control units.

11. The vehicle development support system according to claim 4, further comprising a further operation device located on the frame body and configured to output, in accordance with an operation intentionally performed by an operator, operation signals that are to be input to the electronic control units.

12. The vehicle development support system according to claim 7, further comprising a further operation device located on the frame body and configured to output, in accordance with an operation intentionally performed by an operator, operation signals that are to be input to the electronic control units.

13. The vehicle development support system according to claim 8, further comprising a further operation device located on the frame body and configured to output, in accordance with an operation intentionally performed by an operator, operation signals that are to be input to the electronic control units.

14. The vehicle development support system according to claim 2, further comprising a video display device configured to generate video information using the simulation result from the real-time simulator and display the video information.

15. The vehicle development support system according to claim 3, further comprising a video display device configured to generate video information using the simulation result from the real-time simulator and display the video information.

16. The vehicle development support system according to claim 4, further comprising a video display device configured to generate video information using the simulation result from the real-time simulator and display the video information.

17. The vehicle development support system according to claim 7, further comprising a video display device configured to generate video information using the simulation result from the real-time simulator and display the video information.

18. The vehicle development support system according to claim 8, further comprising a video display device configured to generate video information using the simulation result from the real-time simulator and display the video information.

19. The vehicle development support system according to claim 1, wherein the sensor-based driving information further includes driving video information indicating video signals output from image capturing devices of the vehicle as time series information.

20. A vehicle development support system comprising:

a frame body equipped with physical electronic control units configured to control in-vehicle devices;

a real-time simulator; and a synchronizer configured to synchronize timing of data exchange between the real time simulator and the electronic control units, wherein the real time simulator is configured to:

acquire, via an external information acquisition interface, sensor-based driving information obtained by driving a vehicle in a real space, the sensor-based driving information including driving video information indicating video signals output from image capturing devices of the vehicle as time series information;

provide output signals including the sensor-based driving information to the electronic control units through the synchronizer;

receive control signals generated based on the output signals from the electronic control units through the synchronizer;

calculate physical state amounts indicating operation states of the in-vehicle devices based on the received control signals; and simulate, based on the physical state amounts, operations of the in-vehicle devices at a device level;

simulate, based on the operations of the in-vehicle devices, a behavior of the vehicle caused by the operations of the in-vehicle devices;

generate a simulation result including the behavior of the vehicle; and provide subsequent output signals including subsequent sensor-based driving information to the electronic control units through the synchronizer, the subsequent output signals reflecting the behavior of the vehicle included in the simulation result, wherein the synchronizer is configured to synchronize timing at which the real-time simulator provides the output signals to the electronic control units with timing at which the real-time simulator receives the control signals from the electronic control units.

21. The vehicle development support system according to claim 1, wherein the subsequent output signals reflect the behavior of the vehicle caused by the operations of the in-vehicle devices.

22. The vehicle development support system according to claim 21, wherein the electronic control units are configured to generate later control signals based on the subsequent output signals.

23. The vehicle development support system according to claim 1, wherein the operations of the in-vehicle devices simulated at the device level include an actuator operation of an in-vehicle device.

24. The vehicle development support system according to claim 1, wherein the real-time simulator is configured to reflect an outside environment that affects the behavior of the vehicle in the simulation of the behavior of the vehicle.

* * * * *